United States Patent
May et al.

(10) Patent No.: US 6,654,226 B2
(45) Date of Patent: Nov. 25, 2003

(54) THERMAL LOW K DIELECTRICS

(75) Inventors: Charles E. May, Gresham, OR (US); Derryl D. J. Allman, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/094,520

(22) Filed: Mar. 8, 2002

(65) Prior Publication Data

US 2003/0170973 A1 Sep. 11, 2003

(51) Int. Cl.⁷ .................................................. H01G 4/06
(52) U.S. Cl. ........................ 361/311; 361/313; 361/303; 361/306.1; 361/321.1
(58) Field of Search ................................. 361/311, 313, 361/303, 306.1, 304, 321.1, 321.4, 321.5, 301.4, 320; 438/778, 758

(56) References Cited

U.S. PATENT DOCUMENTS

| | | | | |
|---|---|---|---|---|
| 4,935,844 A | * | 6/1990 | Burn | |
| 5,510,645 A | * | 4/1996 | Fitch et al. | |
| 5,883,781 A | * | 3/1999 | Yamamichi et al. | |
| 5,943,598 A | * | 8/1999 | Lin | |
| 6,251,761 B1 | * | 6/2001 | Rodder et al. | |
| 6,303,047 B1 | * | 10/2001 | Aronowitz et al. | |
| 6,342,448 B1 | * | 1/2002 | Lin et al. | |
| 6,395,649 B1 | * | 5/2002 | Wu | |
| 6,440,876 B1 | * | 8/2002 | Wang et al. | |

* cited by examiner

*Primary Examiner*—Dean A. Reichard
*Assistant Examiner*—Nguyen T. Ha
(74) *Attorney, Agent, or Firm*—Luedeka, Neely & Graham, P.C.

(57) ABSTRACT

An integrated circuit having an electrically insulating layer of an electrically nonconductive material, where the electrically insulating layer is disposed between at least two electrically conductive elements. The electrically nonconductive material is selected from a group of materials having a k value that decreases when subjected to thermal treatment. The electrically nonconductive material is most preferably a boro siloxane.

20 Claims, 2 Drawing Sheets

| 12 | 14 | 12 | 14 | 12 |

10

| 12 | 14 | 12 | 14 | 12 |

THERMAL LOW K DIELECTRICS

FIELD

This invention relates to the field of integrated circuit fabrication. More particularly, this invention relates to reducing capacitive coupling between electrically conductive elements in integrated circuits.

BACKGROUND

New problems are encountered as the size of integrated circuits continues to shrink. For example, materials and processes that were adequate at relatively larger design sizes tend to gradually become less adequate as the size of the integrated circuits gradually decreases. As the size of the integrated circuit is finally reduced to a certain point, some of the previously used materials and processes are found to be inadequate to support proper and reliable operation of the integrated circuit at its new, smaller size.

For example, electrically conductive elements that are spaced apart with an intervening dielectric material tend to form a capacitor. However, when the electrically conductive elements are spaced at a sufficient distance, and the dielectric constant of the intervening dielectric material is sufficiently low, the capacitive coupling between the electrically conductive elements tends to be relatively low and does not tend to effect the operation of the integrated circuit in which the electrically conductive elements are employed. In the past, materials such as silicon oxide provided adequate electrical insulation between electrically conductive elements, without introducing a detrimental amount of capacitive coupling.

However, as the size of the integrated circuit decreases, the electrically conductive elements tend to be placed increasing closer together. Thus, when the same dielectric material as previously employed is used as an electrical insulator between the electrically conductive elements, the capacitive coupling between the electrically conductive elements also tends to increase. Further, the newer, smaller integrated circuits also tend to operate at higher speeds than the older, larger integrated circuits. Therefore, the capacitive coupling between electrically conductive elements tends to have a greater speed impact on the electrical signals being carried on the electrically conductive elements, thus producing a two fold negative impact on the proper and reliable operation of the integrated circuit.

Unfortunately, materials that have been traditionally used to reduce the capacitive coupling between electrically conductive elements also tend to be relatively soft, and tend to not provide adequate structural support for the overlying layers of the integrated circuit that are subsequently formed.

What is needed, therefore, are integrated circuits having reduced capacitive coupling between electrically conductive elements while exhibiting adequate structural support for the subsequently formed overlying layers.

SUMMARY

The above and other needs are met by an integrated circuit having an electrically insulating layer of an electrically nonconductive material, where the electrically insulating layer is disposed between at least two electrically conductive elements. The electrically nonconductive material is selected from a group of materials having a k value that decreases when subjected to thermal treatment. The electrically nonconductive material is most preferably a boro siloxane.

In this manner, the decreased k value of the electrically nonconductive material allows the electrically conductive elements to be placed closer to each other than is typically permissible when using dielectric materials having higher k values, such as silicon oxides. Further, the electrically nonconductive material specifically recited above tends to have higher mechanical stability, or in other words tends to be harder, than other so-called low k materials. Thus, the benefits of using a low k dielectric are realized without the detriment of having a layer that is softer and therefore less mechanically sound.

In another aspect, the invention relates to a method of forming an integrated circuit. An electrically insulating layer of an electrically nonconductive material is formed between at least two electrically conductive elements. The electrically nonconductive material is selected from a group of materials having a k value that decreases when subjected to thermal treatment. The electrically nonconductive material is thermally treated to reduce the k value.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 depicts a cross sectional view of a layer of an integrated circuit, showing dielectric materials disposed between electrically conductive elements.

DETAILED DESCRIPTION

Figure 1:
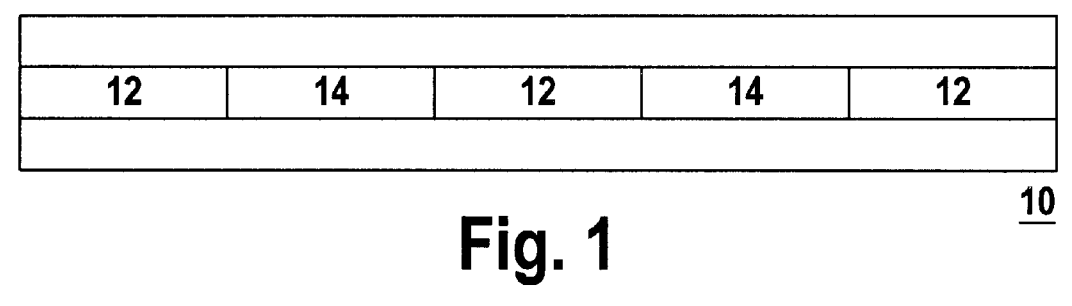
Figure 2:
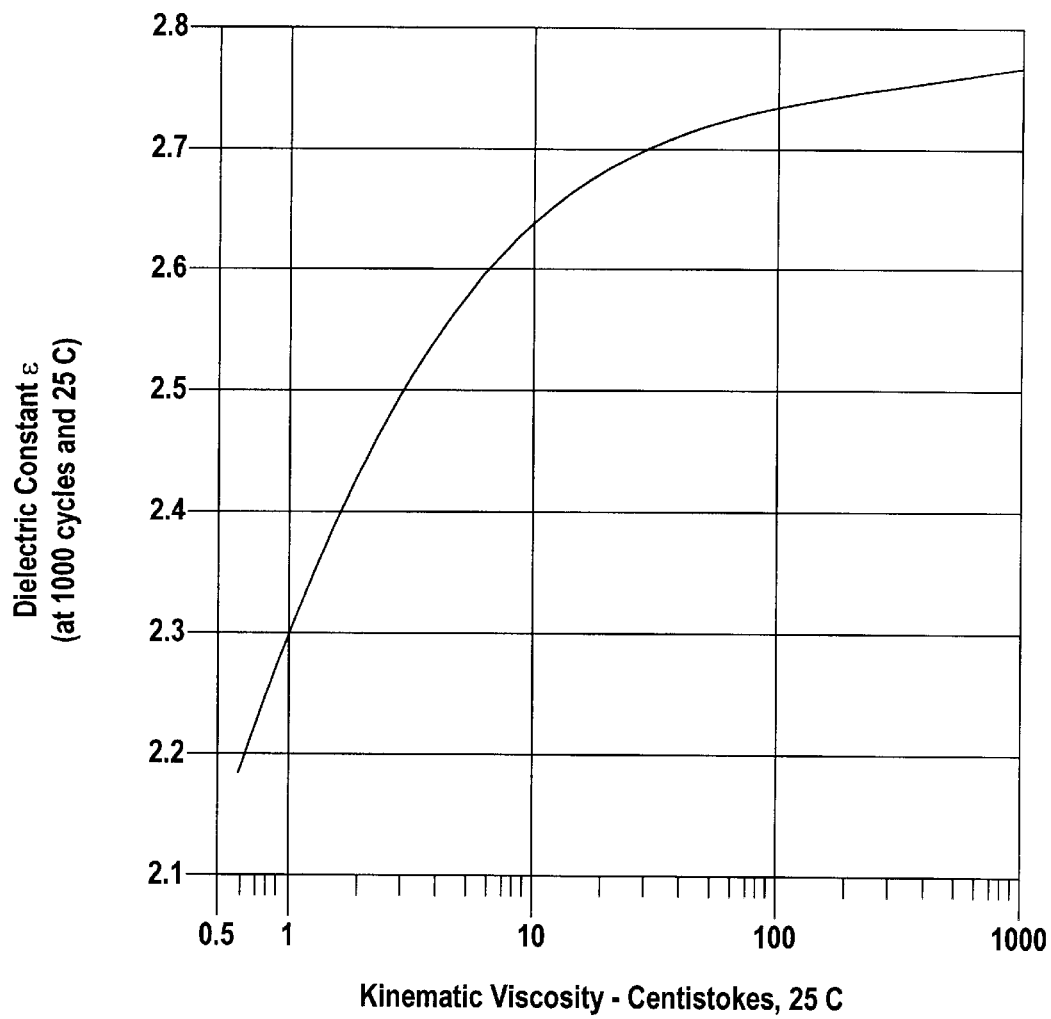
FIG. 2 depicts a chart of dielectric constant values for different viscosities of preferred dielectric materials.

Referring now to FIG. 1, there is depicted a cross sectional view of a layer of an integrated circuit 10, showing dielectric materials 12 disposed between electrically conductive elements 14. The dielectric materials 12 are preferably of a type that exhibit property changes as they are exposed to thermal processing, such as a high temperature anneal. Most preferably, the dielectric materials 12 have k values that decrease as they are exposed to thermal energy.

In this manner, the dielectric materials 12 that are disposed between the conductive elements 14 tend to exhibit k values that decrease through subsequent processing, thus commensurately decreasing the capacitive coupling that would otherwise be exhibited between the electrically conductive elements 14, and thereby allowing for integrated circuit 10 designs in which the electrically conductive elements 14 may be placed closer together than in designs where other materials, such as undoped silicon oxides, are used for the electrical insulation between electrically conductive elements 14. Use of such preferred materials also tends to provide greater mechanical support to the overlying layers of the integrated circuit 10, in comparison to other low k materials, which tend to be relatively soft.

In a preferred embodiment of the invention, a siloxane containing material is doped to form a low k dielectric material 12 as depicted in FIG. 1. The siloxane material can be applied such as by spin coating, screen printing, or chemical vapor deposition. When the siloxane material is cured, such as during a thermal anneal, the viscosity of the material tends to be reduced by the evolution of hydrogen or low molecular weight byproducts. FIG. 2 shows how the dielectric constant of the doped siloxane material changes relative to the viscosity (porosity) of the siloxane material. As mentioned above, the viscosity of the doped siloxane material is reduced with a thermal anneal. The longer the time or the higher the temperature of the thermal anneal, the lower the viscosity of the resultant layer, and the lower the dielectric constant and the k value of the resultant layer.

The siloxane material preferably contains a combination of phenyl, methyl and ethyl organic groups together with a boron hydride or lanthanide containing compound. The boron hydride (such as boric acid or boric esters) or lanthanide compound is added to the final siloxane solution or combined with the initial polymers prior to the polymerization step to form different types of polymers (with the cyclic being the most resistant to reduction). Typical boro siloxanes that can be formed are:

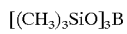

[(CH$_3$)$_3$SiO]$_3$B

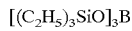

[(C$_2$H$_5$)$_3$SiO]$_3$B

[(C$_2$H$_5$)$_3$SiO]$_2$B(CH$_3$)

The chemistry of adding boron to the siloxane polymer is described on pages 336–339 of "Chemistry and Technology of Silicones" by W. Noll, published by Academic Press, 1968, which is incorporated herein by reference.

Without being bound by theory, it is believed that the lower molecular weight methyl and ethyl organic groups are evolved from the polymer as the temperature of the cure is increased in a low oxygen containing ambient (oxygen content less than about ten percent of the volume of gas). The ethyl group starts to evolve from the film at temperatures less than about two hundred centigrade, while the methyl group removal starts at temperatures above about two hundred and fifty centigrade. The phenyl group starts to evolve at temperatures above about three hundred and fifty centigrade. At temperatures above two hundred and fifty centigrade, the hydrogen from the boron hydride compound is removed and replaced by oxygen. There is a local volume increase with the conversion of boron hydride to boron oxide in the film. The incorporation of a boron oxide composition in the film provides added rigidity to the Si—O—CH$_x$ network preventing its collapse with the removal of the organic groups.

The intent of the cure is to preferably leave behind a high level of phenyl groups, above about twenty-five weight percent, with less than about ten weight percent B$_x$O$_x$ compound. The evolution of the lower molecular weight organic groups increases the porosity (lowers the viscosity) of the final film. The combination of the porosity and carbon content in the film preferably reduces the overall effective dielectric constant of the material below about three.

For the case where lanthanide compounds are added to the polymer network, the intent is the same, with the lanthanide compound adding rigidity to the polymer network as the evolution of the organic groups proceeds during the thermal cure. The preferred method of using lanthanide compounds is as a non-reactive species that is substantially unaffected by the thermal cure and ambient environment. The large molecular weight and volume preferably provides rigidity to the overall Si—O network as the lower molecular weight organic groups are evolved. The concentration level of the lanthanide compounds is preferably kept below about ten weight percent.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit, the improvement comprising an electrically insulating layer of an electrically nonconductive material, disposed between at least two electrically conductive elements, the electrically nonconductive material selected from a group of materials having a k value that decreases when subjected to thermal treatment.

2. The integrated circuit of claim 1, wherein the electrically nonconductive material comprises a boro siloxane.

3. The integrated circuit of claim 1, wherein the electrically nonconductive material comprises porous silox having a boron oxide component for providing structural rigidity to the electrically nonconductive material.

4. The integrated circuit of claim 1, wherein the electrically nonconductive material comprises porous silox having no more than about ten weight percent of a boron oxide component for providing structural rigidity to the electrically nonconductive material.

5. The integrated circuit of claim 1, wherein the electrically nonconductive material comprises porous silox having a boron oxide component for providing structural rigidity to the electrically nonconductive material and including at least about twenty-five weight percent phenyl groups.

6. The integrated circuit of claim 1, wherein the electrically nonconductive material comprises a lanthanide siloxane.

7. The integrated circuit of claim 1, wherein the electrically nonconductive material comprises porous silox having a lanthanide compound for providing structural rigidity to the electrically nonconductive material.

8. The integrated circuit of claim 1, wherein the electrically nonconductive material comprises porous silox having no more than about ten weight percent of a lanthanide compound for providing structural rigidity to the electrically nonconductive material.

9. The integrated circuit of claim 1, wherein the electrically nonconductive material comprises porous silox having a lanthanide compound for providing structural rigidity to the electrically nonconductive material and including at least about twenty-five weight percent phenyl groups.

10. In a method of forming an integrated circuit, the improvement comprising:

forming an electrically insulating layer of an electrically nonconductive material between at least two electrically conductive elements, the electrically nonconductive material selected from a group of materials having a k value that decreases when subjected to thermal treatment, and thermally treating the electrically nonconductive material to reduce the k value.

11. The method of claim 10, wherein the electrically nonconductive material comprises a boro siloxane.

12. The method of claim 10, wherein the electrically nonconductive material comprises porous silox having a boron oxide component for providing increasing structural rigidity to the electrically nonconductive material as the electrically nonconductive material is thermally treated.

13. The method of claim 10, wherein the electrically nonconductive material comprises porous silox having no more than about ten weight percent of a boron oxide component for providing increasing structural rigidily to the electrically nonconductive material as the electrically nonconductive material is thermally treated.

14. The method of claim 10, wherein the electrically noncanductive material comprises porous silox having a boron oxide component for providing increasing structural rigidity to the electrically nonconductive material and including at least about twenty-five weight percent phenyl groups after the electrically nonconductive material is thermally treated.

15. The method of claim 10, wherein the electrically nonconductive material comprises a lanthanide siloxane.

16. The method of claim 10, wherein the electrically nonconductive material comprises porous silox having a lanthanide compound for providing increasing structural rigidity to the electrically nonconductive material as the electrically nonconductive material is thermally treated.

17. The method of claim 10, wherein the electrically nonconductive material comprises porous silox having no more than about ten weight percent of a lanthanide compound for providing increasing structural rigidity to the electrically nonconductive material as the electrically nonconductive material is thermally treated.

18. The method of claim 10, wherein the electrically nonconductive material comprises porous silox having a lanthanide compound for providing increasing structural rigidity to the electrically nonconductive material and including at least about twenty-five weight percent phenyl groups after the electrically nonconductive material is thermally treated.

19. The method of claim 10, wherein the thermal treatment of the electrically nonconductive material is accomplished at a temperature of at least about three hundred and fifty centigrade.

20. An integrated circuit formed by the method of claim 10.

* * * * *